(12) United States Patent
Kaneko et al.

(10) Patent No.: US 10,673,112 B2
(45) Date of Patent: Jun. 2, 2020

(54) COAXIAL LINE, RESONATOR, AND FILTER

(71) Applicant: NEC CORPORATION, Tokyo (JP)

(72) Inventors: Tomoya Kaneko, Tokyo (JP); Daisuke Iwanaka, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 45 days.

(21) Appl. No.: 15/770,640

(22) PCT Filed: Oct. 27, 2015

(86) PCT No.: PCT/JP2015/005403
§ 371 (c)(1),
(2) Date: Apr. 24, 2018

(87) PCT Pub. No.: WO2017/072813
PCT Pub. Date: May 4, 2017

(65) Prior Publication Data
US 2018/0316079 A1 Nov. 1, 2018

(51) Int. Cl.
*H01P 3/06* (2006.01)
*H01P 7/04* (2006.01)
*H01P 1/202* (2006.01)
*H03H 7/38* (2006.01)

(52) U.S. Cl.
CPC .............. *H01P 3/06* (2013.01); *H01P 1/202* (2013.01); *H01P 7/04* (2013.01); *H03H 7/383* (2013.01)

(58) Field of Classification Search
CPC .. H01P 1/202; H01P 3/06; H01P 5/026; H01P 7/04
USPC ........................................ 333/206, 207, 212
See application file for complete search history.

(56) References Cited

U.S. PATENT DOCUMENTS

2013/0112477 A1* 5/2013 Lorenz .................... H01P 1/202
174/99 R

FOREIGN PATENT DOCUMENTS

JP 2007-174519 A 7/2007

OTHER PUBLICATIONS

Liao Shaowei et al., "Coaxial Waveguide Based Left-Handed Transmission Line", IEEE Microwave and Wireless Components Letters, Aug. 2007, pp. 568-570, vol. 17, No. 8.
Shaowei Liao et al., "Left-Handed/Right-Handed Transmission Line Subwavelength Cavity Resonators", IEEE Antennas and Wireless Propagation Letters, 2009, pp. 80-83, vol. 8.
International Search Report for PCT/JP2015/005403 dated Dec. 22, 2015.
Arbaoui et al., "Effect of Core Thickness and Intermediate Layers on Mechanical Properties of Polypropylene Honeycomb Multi-Layer Sandwich Structures", Archives of Metallurgy and Materials, 2014, pp. 11-16, vol. 59, issue 1.

* cited by examiner

Primary Examiner — Rakesh B Patel
(74) Attorney, Agent, or Firm — Sughrue Mion, PLLC

(57) ABSTRACT

A coaxial line having a small transmission loss and a variable operating frequency can be provided. The coaxial line includes one or a plurality of unit structures repeatedly arranged in a direction of a central axis. The unit structure includes an inner conductor, two dielectrics arranged in the central-axial direction so as to sandwich the inner conductor therebetween, an outer conductor configured to envelop the inner conductor and the dielectrics, and an inductor connected between the inner conductor and the outer conductor.

14 Claims, 19 Drawing Sheets

COAXIAL LINE, RESONATOR, AND FILTER

CROSS REFERENCE TO RELATED APPLICATIONS

This application is a National Stage of International Application No. PCT/JP2015/005403 filed Oct. 27, 2015.

TECHNICAL FIELD

The present invention relates to a coaxial line, a resonator, and a filter.

BACKGROUND ART

In recent years, left-handed coaxial lines have been studied. For example, as a left-handed coaxial line, a left-handed transmission line including a plurality of inner conductors repeatedly arranged therein has been proposed (Non-patent Literature 1). In this transmission line, the plurality of inner conductors are coaxially arranged with spaces therebetween. Each of the inner conductors is electrically connected to an outer conductor. The spaces between the inner conductors are filled with PTFE (polyfluortetraethylene). This coaxial line has an excellent pass characteristic over a wide band and can be applied to, for example, a filter and the like.

Further, an example in which a resonator is formed by using a structure similar to that of the above-described coaxial line has also been known (Non-patent Literature 2).

CITATION LIST

Non Patent Literature

Non-patent Literature 1: Liao Shaowei et al., "Coaxial Waveguide Based Left-handed coaxial line", IEEE MICROWAVE AND WIRELESS COMPONENTS LETTERS, VOL. 17, NO. 8, AUGUST 2007, pp. 568-570

Non-patent Literature 2: Shaowei Liao et al., "Left-Handed/Right-Handed Transmission Line Subwavelength Cavity Resonators", IEEE ANTENNAS AND WIRELESS PROPAGATION LETTERS, VOL. 8, 2009, pp. 80-83

SUMMARY OF INVENTION

Technical Problem

However, the inventors have found the following problem in the above-described configuration. In the above-described configuration, there is a drawback that since the resonance frequency band is fixed, it is impossible to support a wide band. In ordinary resonators, as a technique for making a resonance frequency variable, there is a technique in which the length of an inner conductor is made variable and a technique in which a reactance of an inner conductor is changed by connecting a variable-capacitance diode at an end of the inner conductor. However, it is very difficult to directly apply either of these techniques to the above-described configuration.

Further, the technique in which the length of an inner conductor is made variable requires a mechanical driving mechanism and has a drawback that an electrical stability is poor when it is moved while maintaining the mechanical contact. As for the other technique in which the reactance is changed, the variable range of frequencies is limited and the Q value could deteriorate. Therefore, even if these techniques can be applied to the above-described configuration, it is still impossible to increase the variable range of resonance frequencies in a stable operation state.

The present invention has been made in view of the above-described circumstances and an object thereof is to provide a coaxial line having a small transmission loss and a variable operating frequency.

Solution to Problem

A coaxial line according to an embodiment of the present invention includes one unit structure or a plurality of unit structures repeatedly arranged in a direction of a central axis, in which the unit structure includes an inner conductor, two dielectrics arranged in the central-axial direction so as to sandwich the inner conductor therebetween, an outer conductor configured to envelop the inner conductor and the dielectrics, and an inductor connected between the inner conductor and the outer conductor.

Advantageous Effects of Invention

According to the present invention, a coaxial line having a small transmission loss and a variable operating frequency can be provided.

DESCRIPTION OF EMBODIMENTS

First Embodiment

A coaxial line 100 according to a first embodiment is described. The coaxial line 100 is formed as a left-handed coaxial line (i.e., a left-handed meta-material) in which unit structures are periodically and repeatedly arranged. Firstly, a unit structure of the coaxial line 100 is described.

Figure 1:
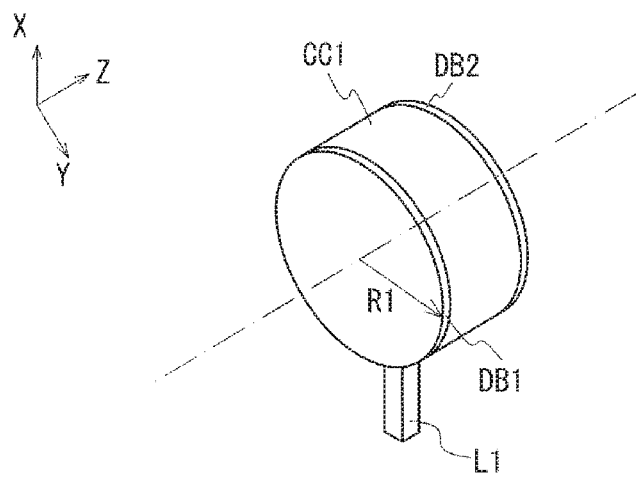
FIG. 1 is a perspective view showing an inner structure of a unit structure of a coaxial line according to a first embodiment.
Figure 2:
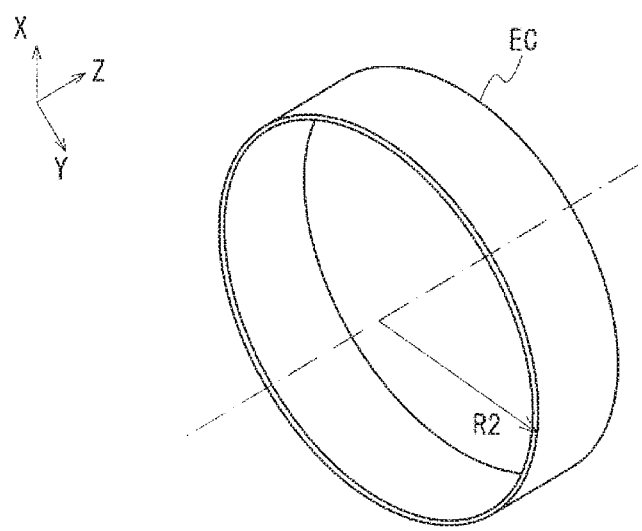
FIG. 2 is a perspective view showing an outer conductor of the unit structure of the coaxial line according to the first embodiment.
Figure 3:
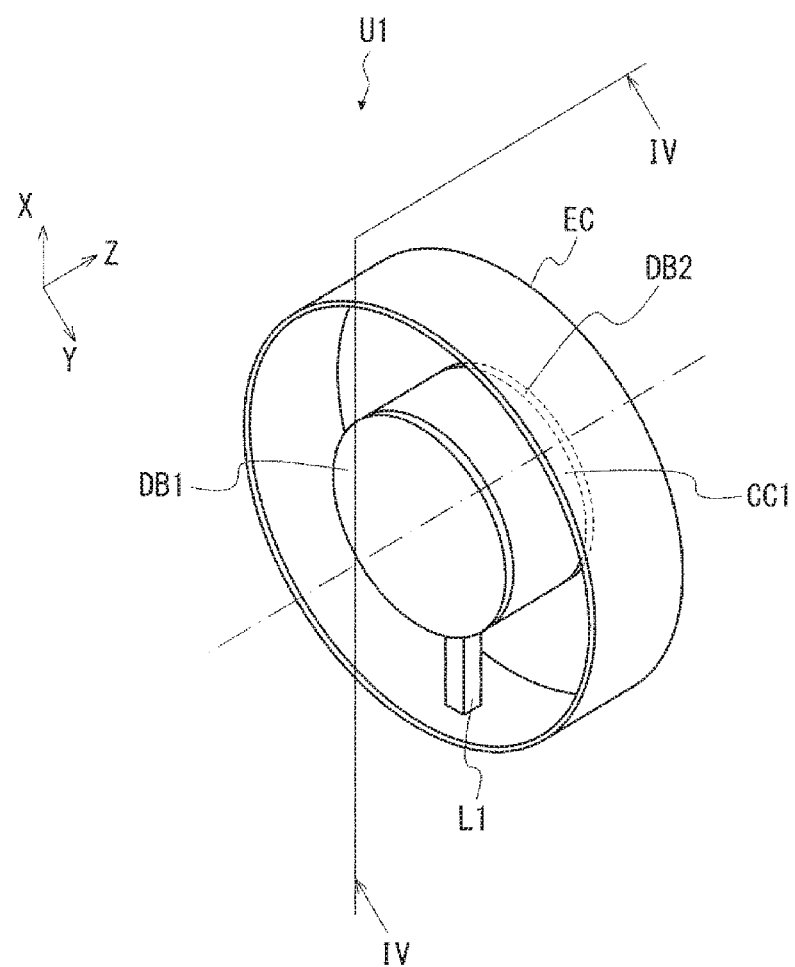
FIG. 3 is a perspective view showing an external appearance of the unit structure of the coaxial line according to the first embodiment.

FIG. 1 is a perspective view showing an inner structure of a unit structure U1 of the coaxial line 100 according to the first embodiment. FIG. 2 is a perspective view showing an outer conductor EC of the unit structure U1 of the coaxial line 100 according to the first embodiment. FIG. 3 is a perspective view showing an external appearance of the unit structure U1 of the coaxial line 100 according to the first embodiment. The unit structure U1 of the coaxial line 100 includes an inner conductor CC1, dielectrics DB1 and DB2, an outer conductor EC, and an inductor L1.

As shown in FIG. 1, the inner conductor CC1 has a cylindrical shape and is configured so that a central axis of the cylindrical shape coincides with a central axis of the coaxial line 100 (a Z-axis direction in FIGS. 1 to 3). For example, a diameter of the circular cross section of the inner conductor CC1 is 12 mm. A height of the cylindrical shape (or a thickness of the disc shape) in the central-axis direction (the Z-axis direction) is, for example, 9.3 mm.

Note that the cylindrical shape in this embodiment and the following embodiments is not limited to ordinary cylinders whose heights between bases of the cylinders are longer than the diameters of the circular cross sections of the cylinders, but instead also includes so-called disk shapes whose heights between bases of the cylinders are shorter than the diameters of the circular cross sections of the cylinders.

As shown in FIG. 1, each of the dielectrics DB1 and DB2 has a cylindrical shape and is configured so that the central axis of the cylindrical shape coincides with the central axis of the coaxial line 100. Further, the dielectrics DB1 and DB2 are disposed so as to sandwich the inner conductor CC1 therebetween. Note that in this embodiment, one of the bases of the inner conductor CC1 is in contact with the dielectric DB1 and the other base is in contact with the dielectric DB2. A diameter of the circular cross section of each of the dielectrics DB1 and DB2 is the same as that of the inner conductor CC1 (for example, 12 mm). A height of the cylindrical shape (or a thickness of the disc shape) in the central-axis direction is, for example, 1 mm.

As shown in FIGS. 2 and 3, the outer conductor EC has a cylindrical shape in such a manner that the conductor forms a circle around the central axis of the coaxial line 100 and is configured so that the central axis of the cylindrical shape coincides with the central axis of the coaxial line 100. Further, the outer conductor EC is disposed so as to envelop the above-described inner conductor CC1 and the dielectrics DB1 and DB2. That is, a diameter R2 (e.g., 20 mm) of a hollow part inside the cylinder in the cross section of the outer conductor EC is larger than a diameter R1 of the circular cross section of the inner conductor CC1 and the dielectrics DB1 and DB2.

Figure 4:
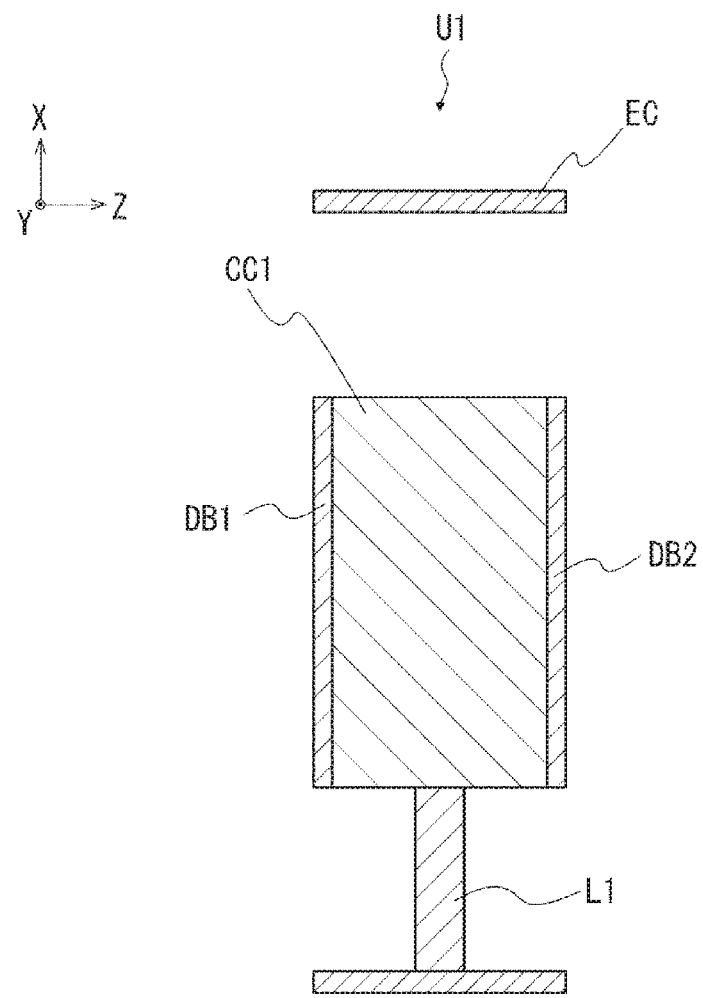
FIG. 4 is a cross section of the unit structure taken along a line IV-IV in FIG. 3.

FIG. 4 is a cross section of a unit structure U1 taken along a line IV-IV in FIG. 3. As shown in FIG. 4, the inner conductor CC1 is electrically connected to the outer conductor EC through the inductor L1.

Figure 5:
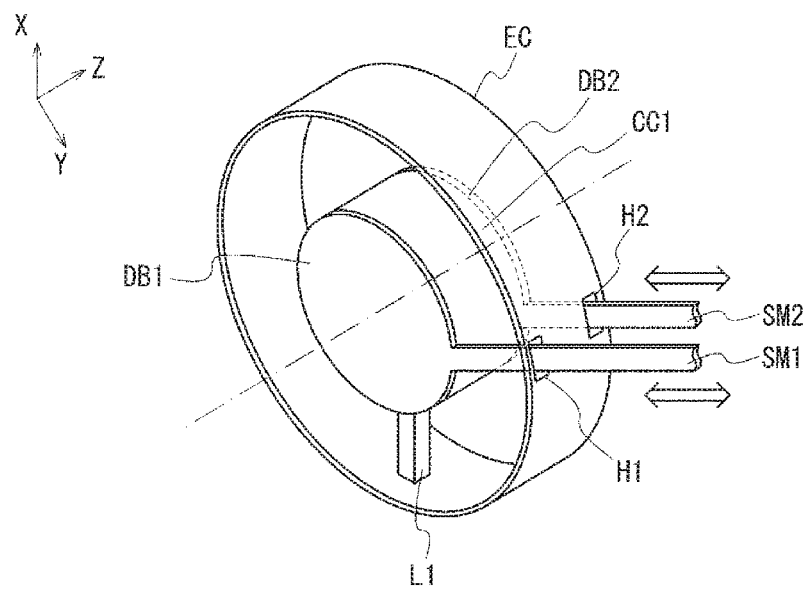
FIG. 5 is a perspective view showing an example of a structure of a dielectric according to the first embodiment.

In this embodiment, the unit structure is configured so that an effective dielectric constant in places where the dielectrics DB1 and DB2 are placed can be changed. An example of a technique for changing an effective dielectric constant in this embodiment is described hereinafter. FIG. 5 is a perspective view showing a configuration example of the dielectrics DB1 and DB2 according to the first embodiment. As described above, the dielectrics DB1 and DB2 have cylindrical shapes and have support parts SM1 and SM2, respectively, protruding from the outer circumferences of their cylindrical shapes in a radial direction, i.e., in a direction perpendicular to the central axis. Holes H1 and H2 through which the support parts SM1 and SM2, respectively, can be inserted are formed in the outer conductor EC and the support parts SM1 and SM2 extend to the outside of the outer conductor EC through these holes H1 and H2. The support parts SM1 and SM2 can be driven in the radial direction by a driving part such as a motor provided outside the outer conductor EC. In this way, it is possible to change areas where the dielectrics DB1 and DB2 overlap the inner conductor CC1 in the central-axis direction. As a result, it is possible to change an effective dielectric constant of spaces where the dielectrics DB1 and DB2 are disposed. In other words, it is possible to change the effective dielectric constant of the spaces located at both ends of the inner conductor CC1.

Figure 6:
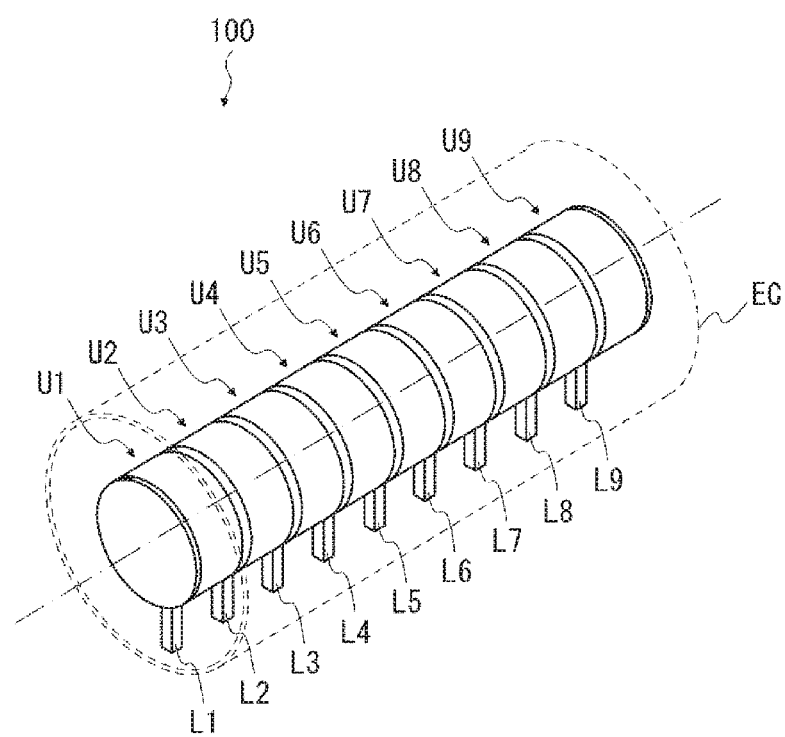
FIG. 6 is a diagram showing a configuration example of a coaxial line in which nine unit structures are repeatedly arranged.

By repeatedly arranging unit structures in the central-axis direction as described above, it is possible to form a left-handed meta-material structure. FIG. 6 is a diagram showing a configuration example of a coaxial line in which nine unit structures are repeatedly arranged. In FIG. 6, the outer conductor EC is indicated by broken lines in order to simplify the drawing. In this example, unit structures U1 to U9 each of which corresponds to the unit structure U1 shown in FIG. 1 are repeatedly arranged in the central-axis direction.

Figure 7:
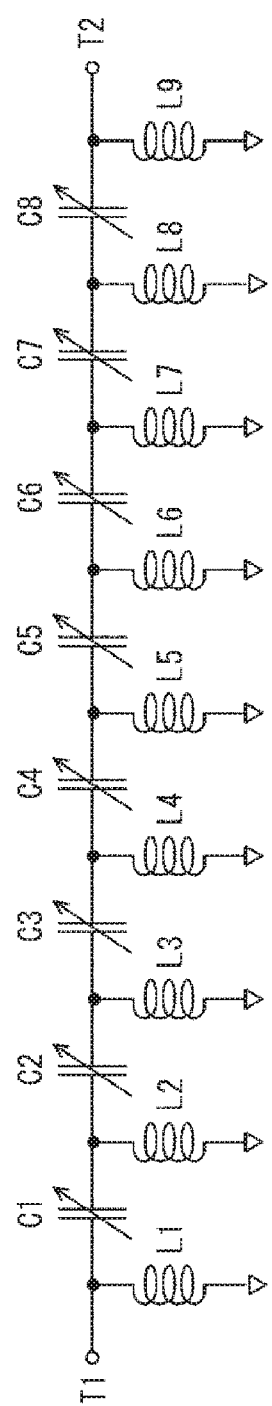
FIG. 7 is an equivalent circuit diagram of the coaxial line shown in FIG. 6.

FIG. 7 is an equivalent circuit diagram of the coaxial line 100 shown in FIG. 6. As shown in FIG. 7, in the coaxial line 100, the unit structures U1 to U9 form variable capacitors C1 to C8 connected between terminals T1 and T2. Note that in FIG. 7, the inductors L1 included in the unit structures U1 to U9 are represented as inductors L1 to L9 for the sake of convenience. Both ends of each of the variable capacitors C1 to C8 are connected to the outer conductor EC through the inductors L1 to L9 and are thereby connected to the ground as shown in FIG. 4.

Note that in the configuration of the coaxial line 100 shown in FIG. 7, an example in which the coaxial line is formed by nine unit structures is explained for facilitating the understanding of the configuration according to the invention. However, a coaxial line according to this embodiment may have any configuration in which at least two unit structures are arranged along the central axis in a cascade manner.

Figure 8:
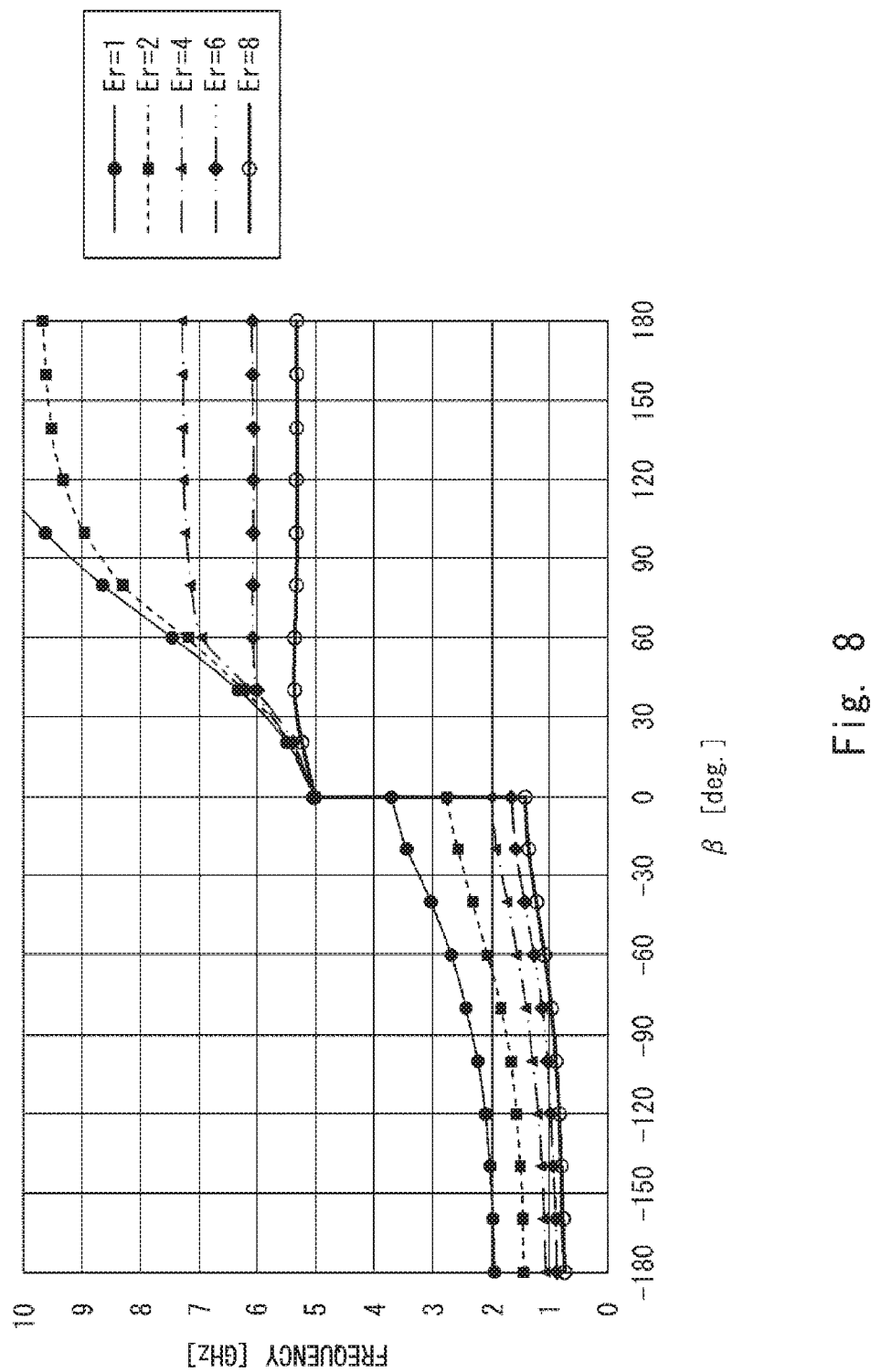
FIG. 8 is a graph showing frequency characteristics over phases of electromagnetic waves in a coaxial line according to the first embodiment.

Next, a frequency characteristic of the coaxial line 100 is described. FIG. 8 is a graph showing frequency characteristics over phases of electromagnetic waves in the coaxial line 100 according to the first embodiment. FIG. 8 shows frequency characteristics over phases of electromagnetic waves in cases where a relative dielectric constant (Er) of a dielectric is 1, 2, 4, 6 and 8, respectively, in a coaxial line including nine unit structures. In FIG. 8, a region where the phase (β) is negative indicates an operation as a left-handed coaxial line.

Figure 9:
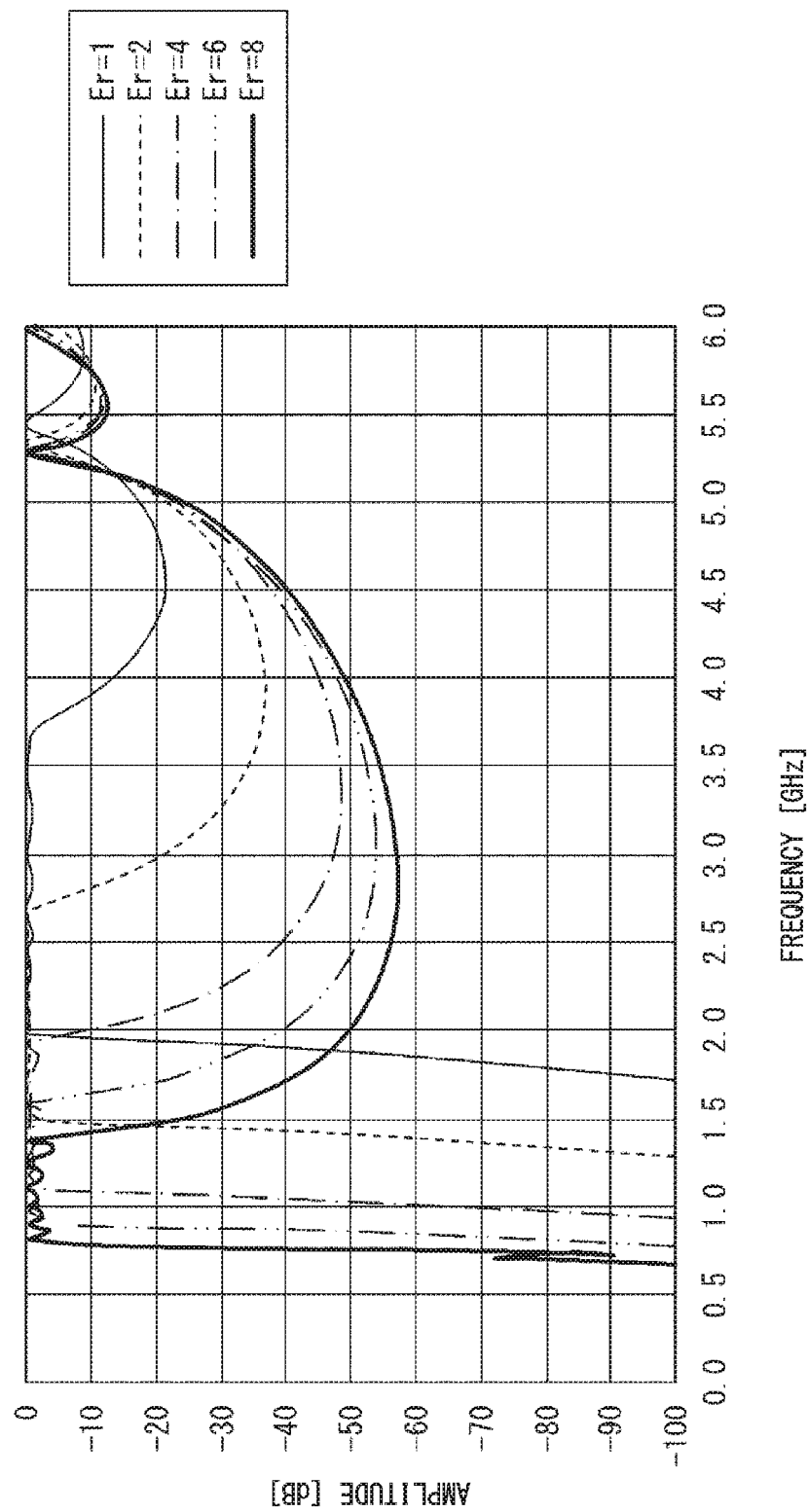
FIG. 9 is a graph showing pass characteristics of electromagnetic waves in a coaxial line according to the first embodiment.

FIG. 9 is a graph showing pass characteristics of electromagnetic waves in a coaxial line according to the first embodiment. Similarly to FIG. 5, FIG. 9 shows pass characteristics of electromagnetic waves in cases where a relative dielectric constant (Er) of a dielectric is 1, 2, 4, 6 and 8, respectively, in a coaxial line including nine unit structures. In FIG. 9, a region on the left side of the center of the graph in which the amplitude fluctuates around 0 [dB] indicates an operation as a left-handed coaxial line. As shown in FIG. 9, it can be understood that it is possible to adjust the pass characteristic of electromagnetic waves of the coaxial line according to this embodiment by changing the relative dielectric constant of the dielectric. Specifically, it can be understood that the more the relative dielectric constant is increased, the lower the frequencies of the electromagnetic waves that can pass through the coaxial line become.

As described above, according to this configuration, it is possible to adjust the pass characteristic of the coaxial line by changing the relative dielectric constant of the dielectric constituting the coaxial line that functions as a left-handed meta-material.

Second Embodiment

Figure 10:
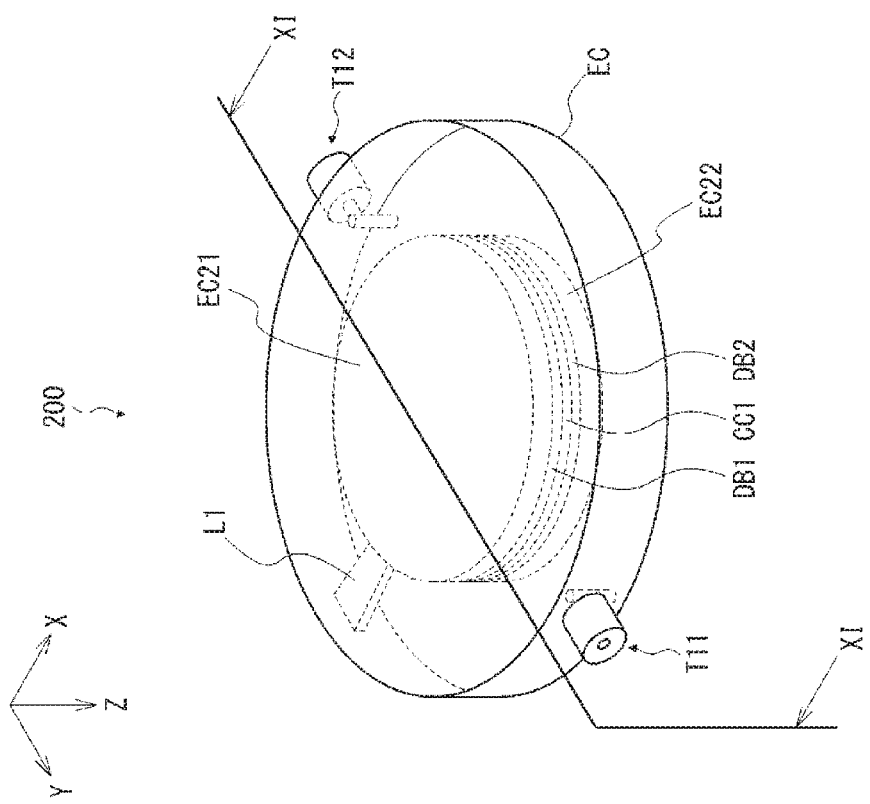
FIG. 10 is a perspective view schematically showing a configuration of a resonator according to a second embodiment.
Figure 11:
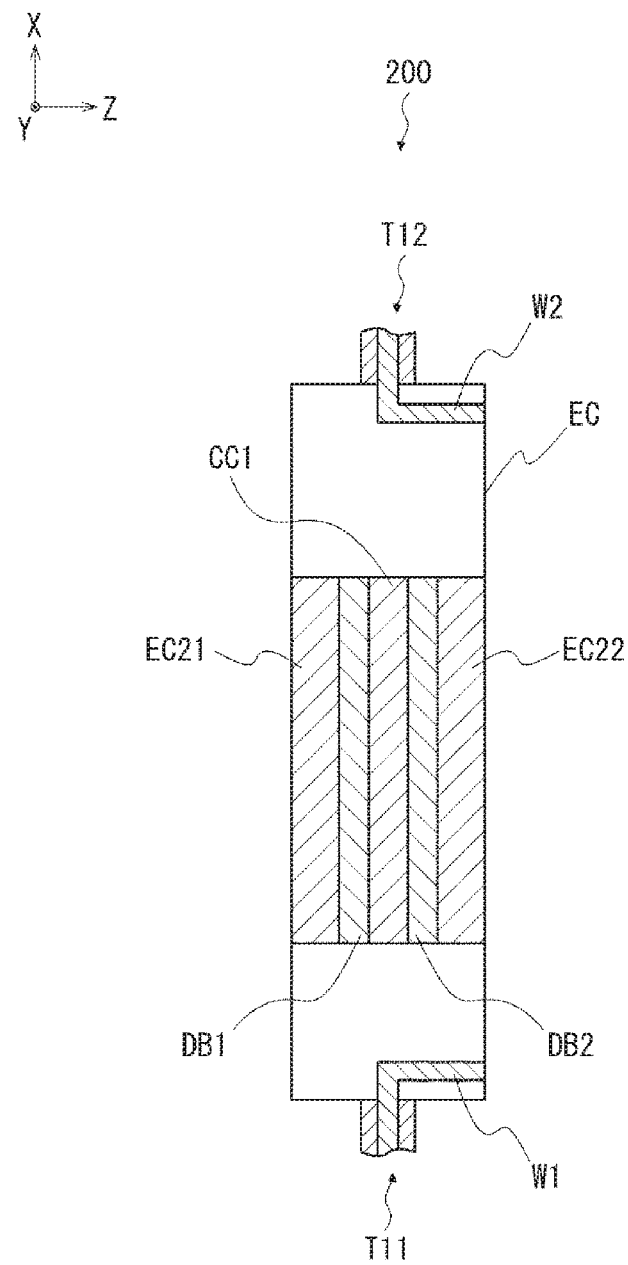
FIG. 11 is a cross section of the resonator taken along a line XI-XI in FIG. 10.

A resonator 200 according to a second embodiment is described. The resonator 200 is an application example of the coaxial line 100 according to the first embodiment. The resonator 200 is formed by using the unit structure of the coaxial line 100. FIG. 10 is a perspective view schematically showing a configuration of the resonator 200 according to the second embodiment. FIG. 11 is a cross section of the resonator 200 taken along a line XI-XI in FIG. 10. The resonator 200 has a configuration that is obtained by adding input/output terminals T11 and T12, and outer conductor plates EC21 and EC22 in the unit structure U1 shown in FIG. 1.

The outer conductor plates EC21 and EC22 are arranged side by side in the central-axis direction so as to sandwich the unit structure U1 therebetween. An outer conductor EC is formed so that the inside thereof becomes a hollow cylinder and is electrically connected to the outer conductor plates EC21 and EC22. A wiring line W1 connected to an inner wall surface of the outer conductor EC is formed in the input/output terminal T11. Similarly, a wiring line W2 connected to an inner wall surface of the outer conductor EC is formed in the input/output terminal T12.

Figure 12:
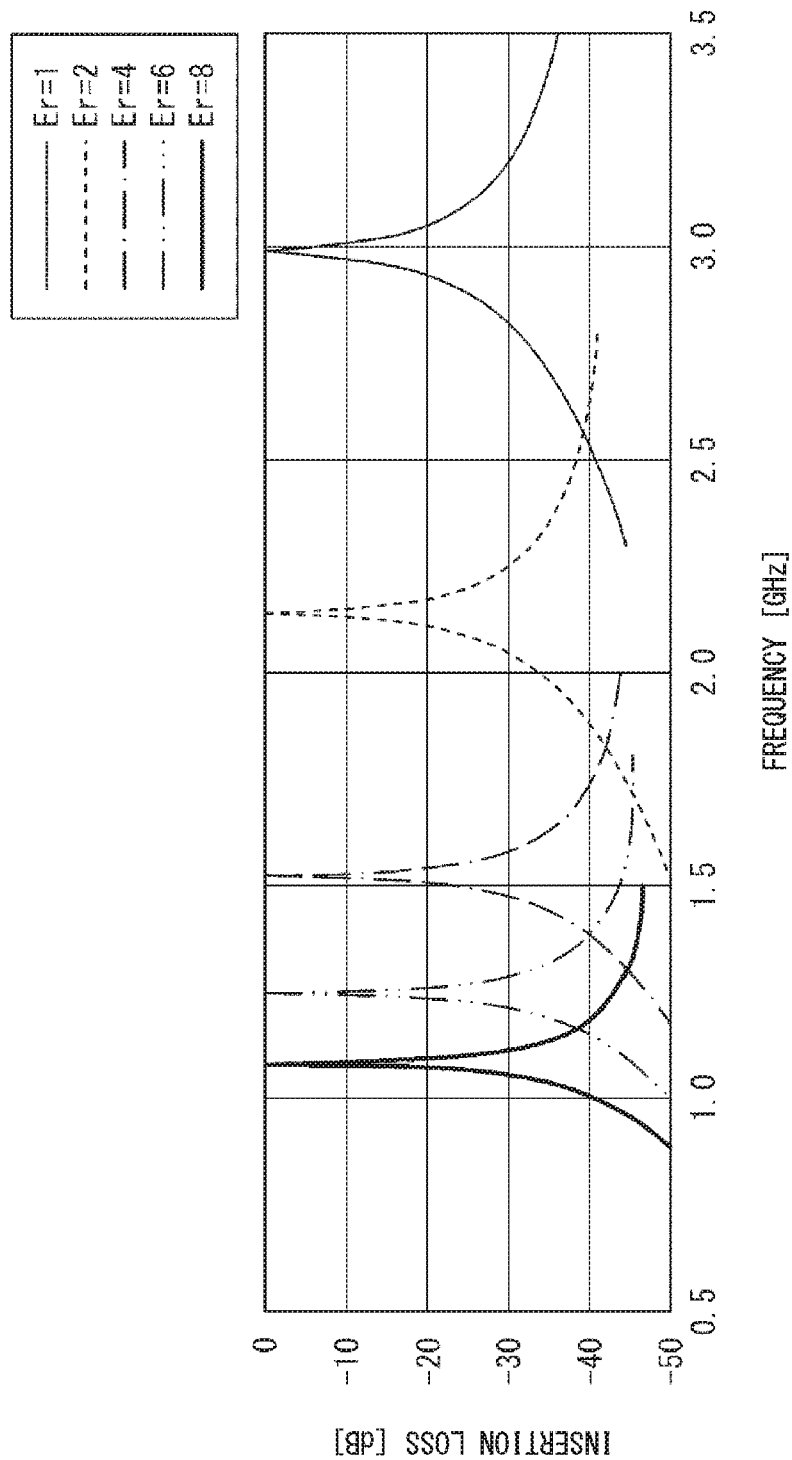
FIG. 12 is a graph showing pass characteristics of a resonator according to the second embodiment.
Figure 13:
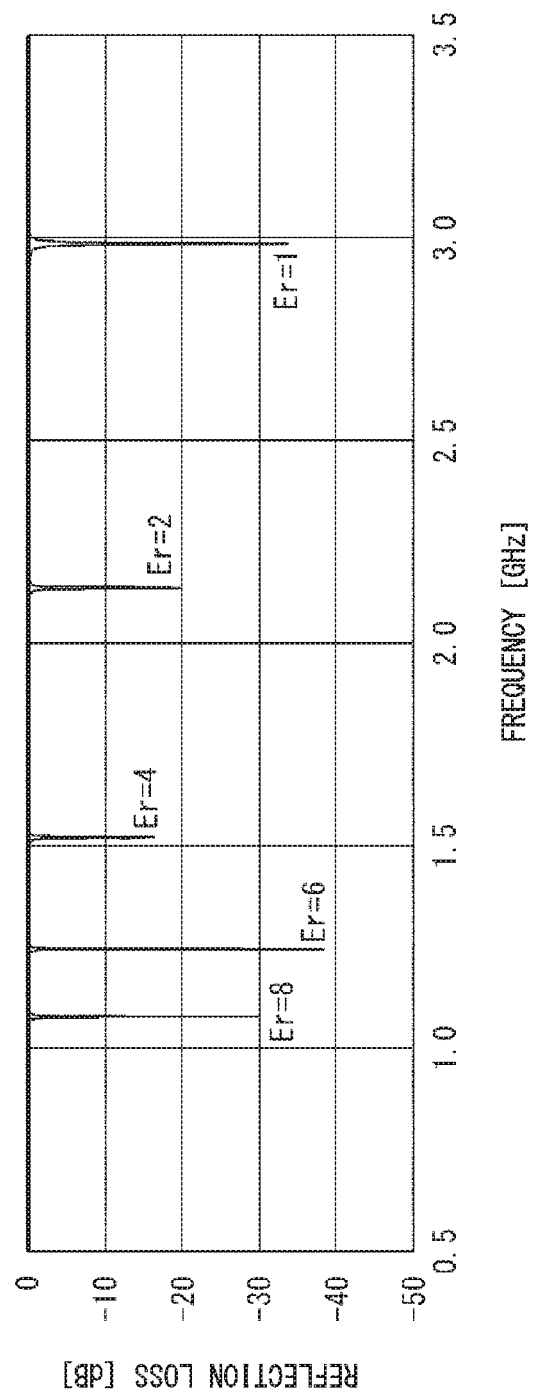
FIG. 13 is a graph showing reflection characteristics of a resonator according to the second embodiment.

FIG. 12 is a graph showing pass characteristics of the resonator 200 according to the second embodiment, and FIG. 13 is a graph showing reflection characteristics of the resonator 200 according to the second embodiment. FIGS. 12 and 13 show frequency characteristics in cases where a relative dielectric constant (Er) of a dielectric is 1, 2, 4, 6 and 8, respectively. The resonance frequency of the resonator 200 can be adjusted in such a manner that the larger the relative dielectric constant becomes, the lower the resonance frequency becomes. That is, according to this configuration, it is possible to adjust the resonance frequency of the resonator by changing the relative dielectric constant of the dielectric constituting the resonator.

Note that in this embodiment, an inductive coupling in which the wiring lines W1 and W2 of the input/output terminals T11 and T12 are connected to the inner surface of the outer conductor EC has been described. However, this configuration is merely an example. For example, the so-called capacitive coupling in which the wiring lines W1 and W2 of the input/output terminals T11 and T12 are not in contact with the other components can also be used.

Figure 14:
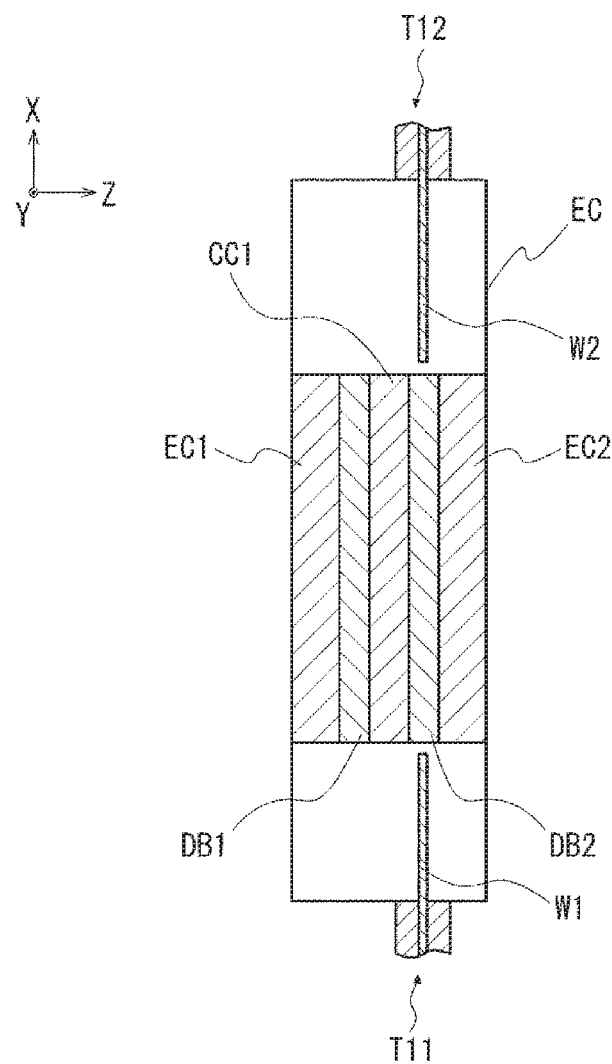
FIG. 14 is a cross section showing an example of a capacitive coupling in a resonator.

FIG. 14 is a cross section showing an example of a capacitive coupling in a resonator. As shown in FIG. 14, it is possible to form a resonator in which signals can be received/output by using a capacitive coupling by disposing, for example, open ends of the wiring lines W1 and W2 of the input/output terminals T11 and T12 in such a manner that they are located near the inner conductor CC1 but are spaced therefrom.

Figure 15:
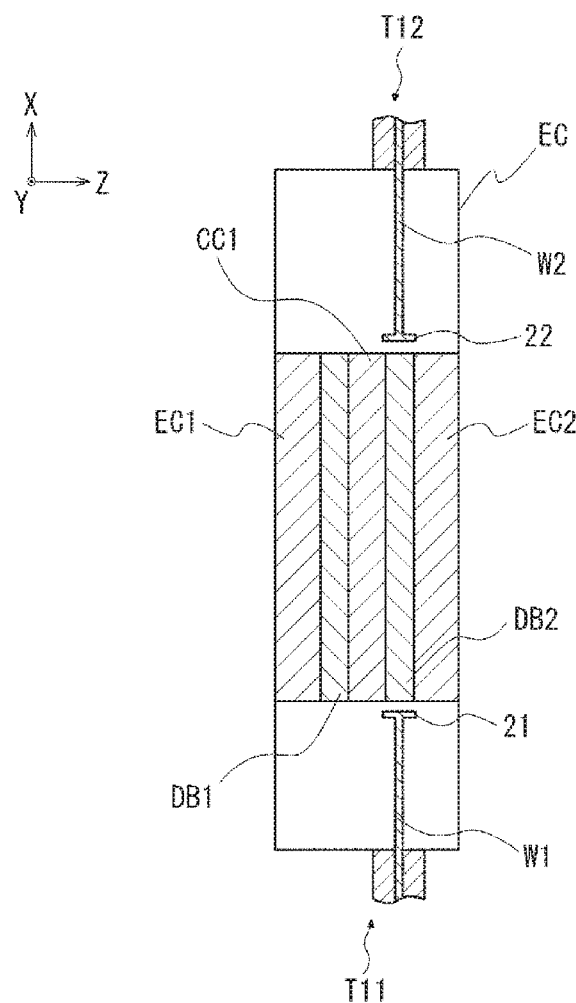
FIG. 15 is a cross section showing a modified example of a capacitive coupling in a resonator.

FIG. 15 is a cross section showing a modified example of a capacitive coupling in a resonator. As shown in FIG. 15, conductive flat plates 21 and 22 may be connected to the open ends of the wiring lines W1 and W2 of the input/output terminals T11 and T12, respectively, shown in FIG. 14. According to this configuration, it is possible to adjust capacitances between the open ends and the inner conductor by appropriately designing the conductive flat plates.

Figure 16:
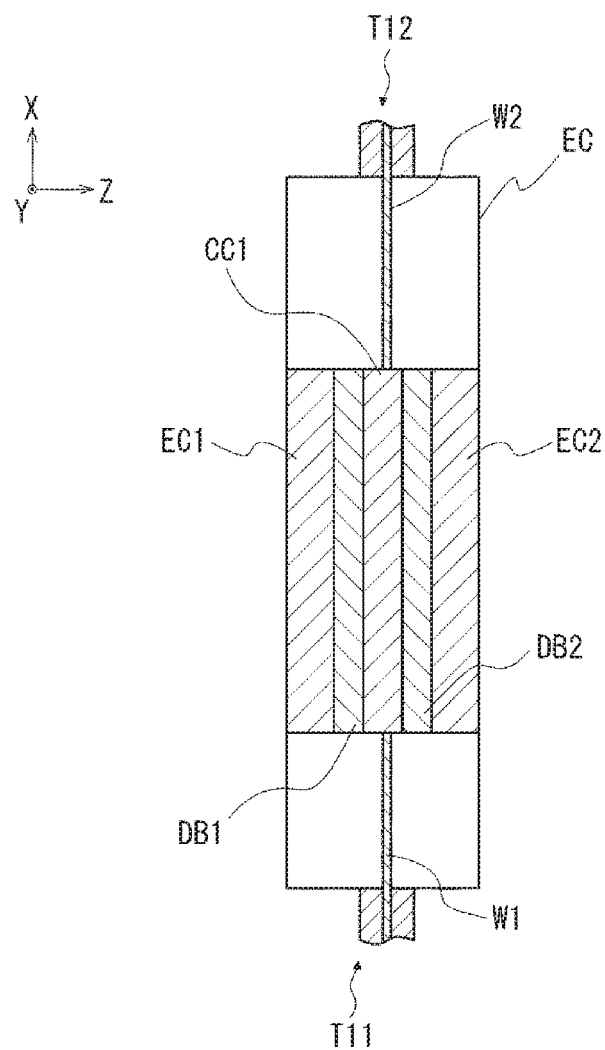
FIG. 16 is a cross section showing a direct connection coupling in a resonator.

Note that it is possible to couple the wiring lines W1 and W2 of the input/output terminals T11 and T12 to the inner conductor by using a direct connection coupling. FIG. 16 is a cross section showing a direct connection coupling in a resonator. As shown in FIG. 16, each of the open ends of the wiring lines W1 and W2 of the input/output terminals T11 and T12 shown in FIG. 14 may be directly connected to the inner conductor CC1.

In FIGS. 14 to 16, the outer conductor EC is shown as a conductor formed by a thin conductor for simplifying the drawing. However, the thickness of the outer conductor EC is not limited to the examples shown in FIGS. 14 to 16.

Third Embodiment

Figure 17:
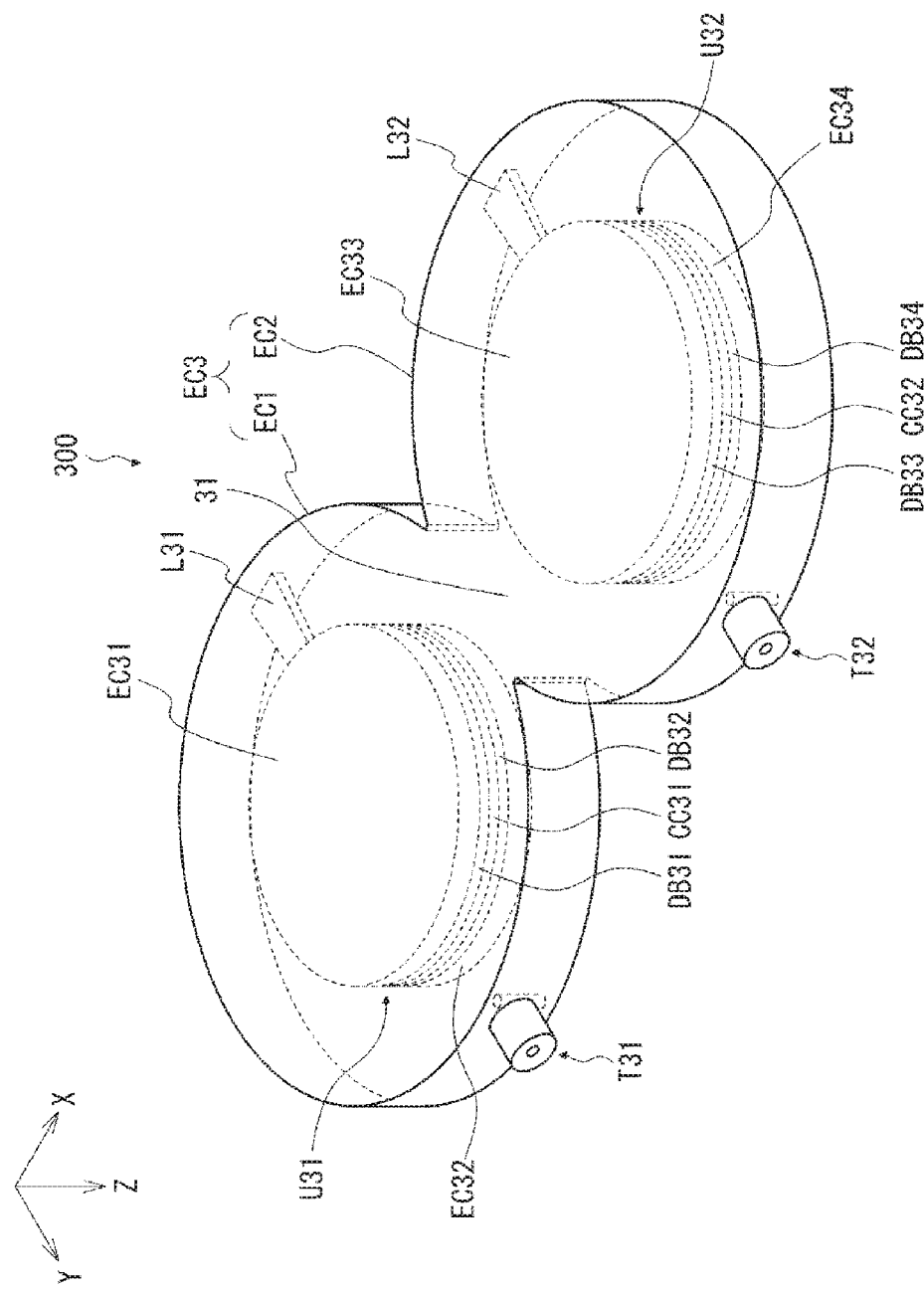
FIG. 17 is a perspective view schematically showing a configuration of a filter according to a third embodiment.

A filter 300 according to a third embodiment is described. The filter 300 is an application example of the coaxial line 100 according to the first embodiment. The filter 300 is formed by using the unit structure of the coaxial line 100. FIG. 17 is a perspective view schematically showing a configuration of the filter 300 according to the third embodiment. The filter 300 includes unit structures U31 and U32 each of which corresponds to the unit structure U1 shown in FIG. 1, input/output terminals T31 and T32, and outer conductor plates EC31 to EC34.

The unit structures U31 and U32 are arranged so that their central axes are parallel to each other, and are arranged side by side on a plane perpendicular to these central axes.

An inner conductor CC31 of the unit structures U31 corresponds to the inner conductor CC1 of the unit structure U1. Dielectrics DB31 and DB32 of the unit structure U31 correspond to the dielectrics DB1 and DB2, respectively, of the unit structure U1. An inductor L31 of the unit structure U31 corresponds to the inductor L1 of the unit structure U1. An outer conductor EC1 of the unit structure U31 corresponds to the outer conductor EC of the unit structure U1. Outer conductor plates EC31 and EC32 electrically connected to the outer conductor EC1 are arranged side by side in the central-axis direction so as to sandwich the inner conductor CC31, and the dielectrics DB31 and DB32 therebetween.

An inner conductor CC32 of the unit structures U32 corresponds to the inner conductor CC1 of the unit structure U1. Dielectrics DB33 and DB34 of the unit structure U32 correspond to the dielectrics DB1 and DB2, respectively, of the unit structure U1. An inductor L32 of the unit structure U32 corresponds to the inductor L1 of the unit structure U1. An outer conductor EC2 of the unit structure U32 corresponds to the outer conductor EC of the unit structure U1. Outer conductor plates EC33 and EC34 electrically connected to the outer conductor EC2 are arranged side by side in the central-axis direction so as to sandwich the inner conductor CC32 and the dielectrics DB33 and DB34 therebetween.

The outer conductors EC1 and EC2 are arranged so as to partially overlap each other. An opening part 31 is formed in the overlapped part between the outer conductors EC1 and EC2. In this way, internal spaces of the external conductors EC1 and EC2 are connected to each other through the opening part 31 and hence they form one internal space. That is, it can be considered that the outer conductors EC1 and EC2 are united together and form one outer conductor EC3.

The unit structure U31 includes an input/output terminal T31 provided therein. A wiring line connected to an inner wall surface of the outer conductor EC1 of the unit structure U31 is formed in the input/output terminal T31. The unit structure U32 includes an input/output terminal T32 provided therein. A wiring line connected to an inner wall surface of the outer conductor EC2 of the unit structure U32 is formed in the input/output terminal T32.

Note that in the filter according to this embodiment, the coupling of the wiring lines of the input/output terminals is not limited to the inductive coupling. That is, they can be electrically connected to the filter by a capacitive coupling as described above.

Figure 18:
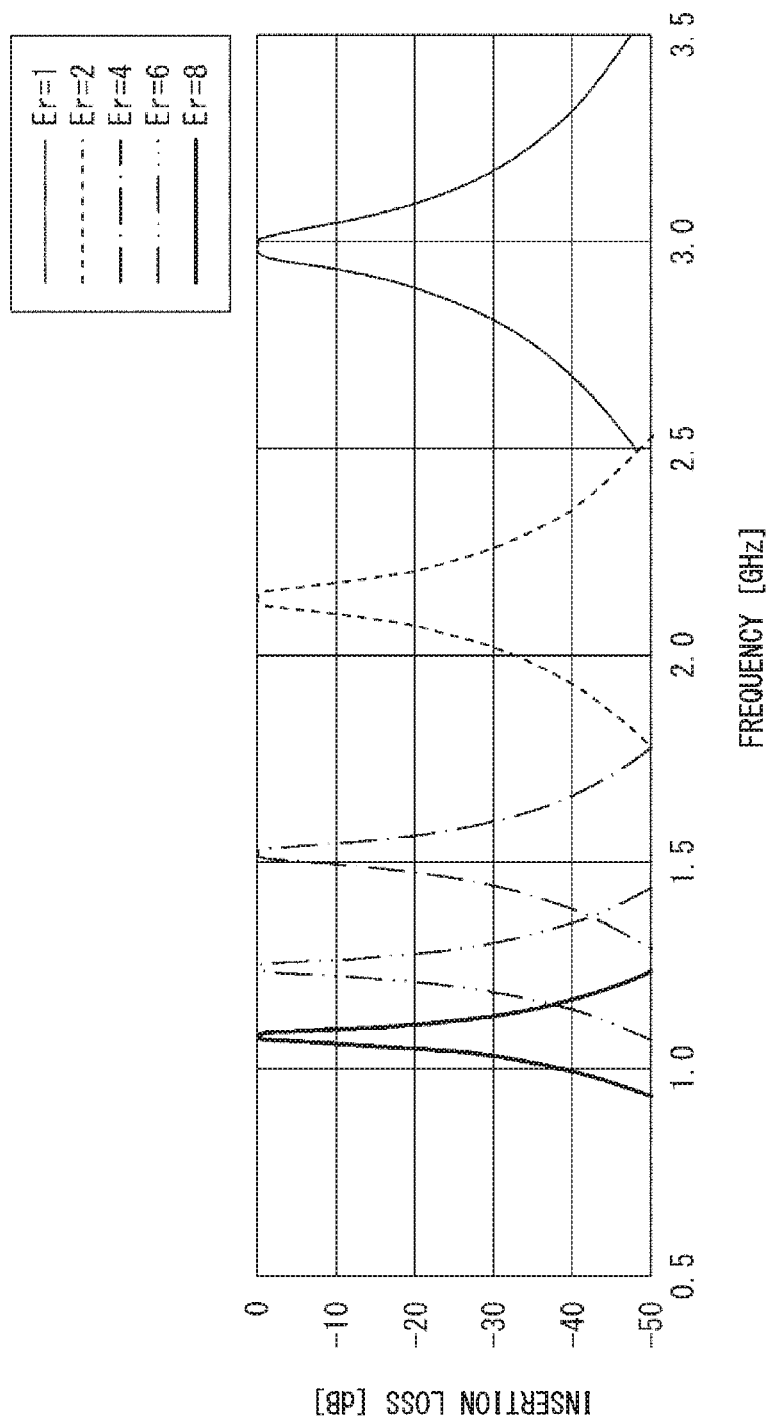
FIG. 18 is a graph showing pass characteristics of a filter according to the third embodiment.
Figure 19:
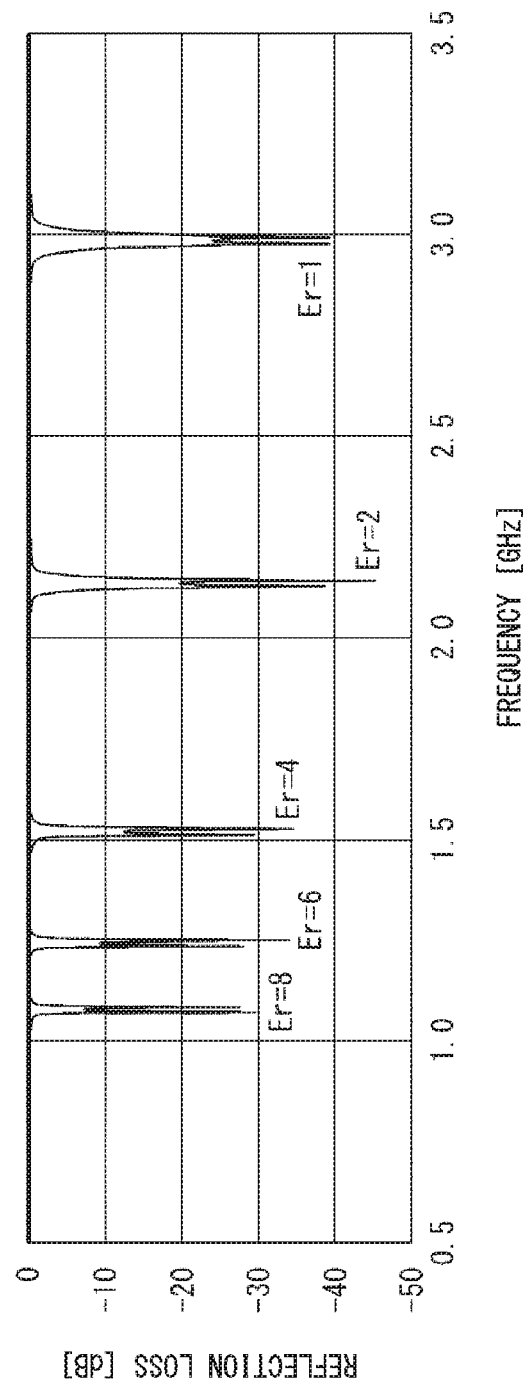
FIG. 19 is a graph showing reflection characteristics of a filter according to the third embodiment.

FIG. 18 is a graph showing pass characteristics of the filter 300 according to the third embodiment, and FIG. 19 is a graph showing reflection characteristics of the filter 300 according to the third embodiment. FIGS. 18 and 19 show frequency characteristics in cases where a relative dielectric constant (Er) of a dielectric is 1, 2, 4, 6 and 8, respectively. It can be understood that the filter 300 is configured in such a manner that the larger the relative dielectric constant becomes, the lower the center frequency of a band having an excellent pass characteristic becomes. That is, according to this configuration, it is possible to adjust the center frequency of a band having an excellent pass characteristic by changing the relative dielectric constant of the dielectric constituting the filter.

Fourth Embodiment

Figure 20:
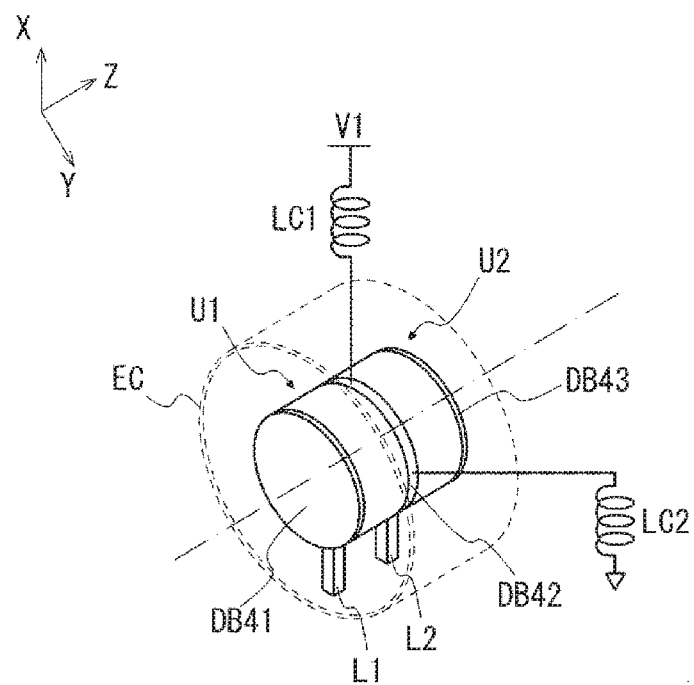
FIG. 20 is a diagram showing a structure example of a dielectric according to a fourth embodiment.

A technique for changing an effective dielectric constant has been described above with reference to FIG. 2. In this embodiment, another example of a technique for changing an effective dielectric constant is described. FIG. 20 is a diagram showing a configuration example of dielectrics DB1 and DB2 according to a fourth embodiment. FIG. 20 shows a coaxial line including two unit structures U1 and U2 as an example. For the sake of convenience, a dielectric DB1 of the unit structure U1 is referred to as DB41, and a dielectric DB2 of the unit structure U1 and a dielectric DB1 of the unit structure U2 are collectively referred to DB42. Further, a dielectric DB2 of the unit structure U2 is represented by DB43. Further, in FIG. 20, an outer conductor EC is indicated by broken lines in order to simplify the drawing.

In this embodiment, for example, the dielectric DB42 is made of a material whose relative dielectric constant is changed by applying a DC (Direct-Current) voltage to the material. For example, a ferroelectric material such as BST $(Ba_wSr_xTi_yO_z)$ or BTO $(Ba_xTi_yO_z)$ can be used as the material whose relative dielectric constant is changed by applying a DC voltage to the material.

A DC voltage is applied to the dielectric DB42 through a choke circuit including a DC variable voltage source V1, and inductors LC1 and LC2. In this example, the dielectric DB42 is connected to the DC variable voltage source V1 through the inductor LC1 and connected to the grounded through the inductor LC2.

The inductor LC1 is, for example, inserted into an opening formed in the outer conductor EC, so that the DC variable voltage source V1 is connected to the dielectric DB42. The inductor LC2 is, for example, inserted into an opening formed in the outer conductor EC, so that the dielectric DB42 is connected to the ground. In FIG. 20, illustration of the holes formed in the outer conductor EC is omitted to simplify the drawing.

It should be noted that it is preferable to use, as each of the inductors LC1 and LC2, an inductor having an impedance having such magnitude that an impedance between the dielectric DB42 and the external power supply (the DC variable voltage source V1) becomes negligible in frequencies to which the coaxial line, the resonator, or the filter including the unit structure(s) according to this embodiment incorporated therein is applied.

According to this configuration, it is possible to adjust the frequency characteristic of the coaxial line, the resonator, or the filter just by changing a DC voltage applied to the dielectric. Further, since the above-described configuration does not require a driving unit or the like for driving the dielectric, it is advantageous in regard to the reduction in the size of the coaxial line, the resonator, or the filter, and the improvement in the reliability thereof.

Note that although an example in which a DC voltage is applied to the dielectric DB42 through the choke circuit is described in this embodiment, a DC voltage may be applied to one or both of the dielectrics DB41 and DB42 through a choke circuit. That is, it is possible to apply a configuration in which a DC voltage is applied to some or all of a plurality of dielectrics constituting the coaxial line, the resonator, or the filter circuit through a choke circuit.

Fifth Embodiment

Figure 21:
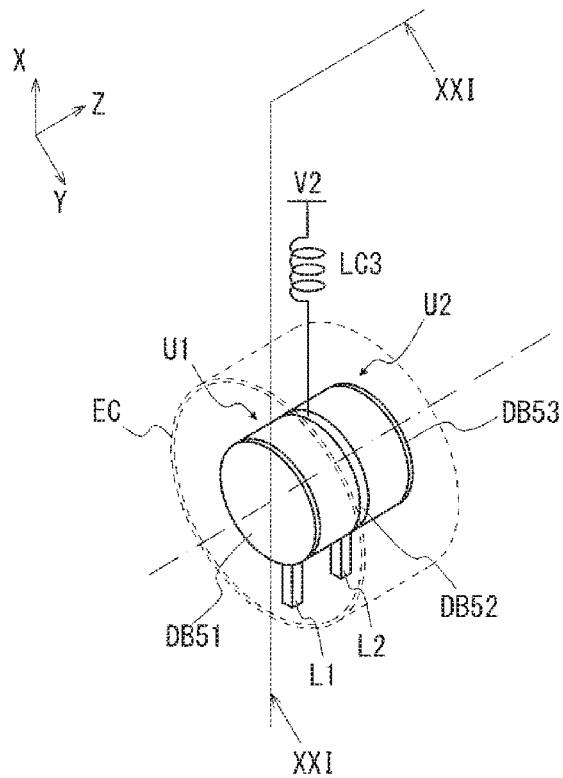
FIG. 21 is a diagram showing a structure example of a dielectric according to a fifth embodiment.
Figure 22:
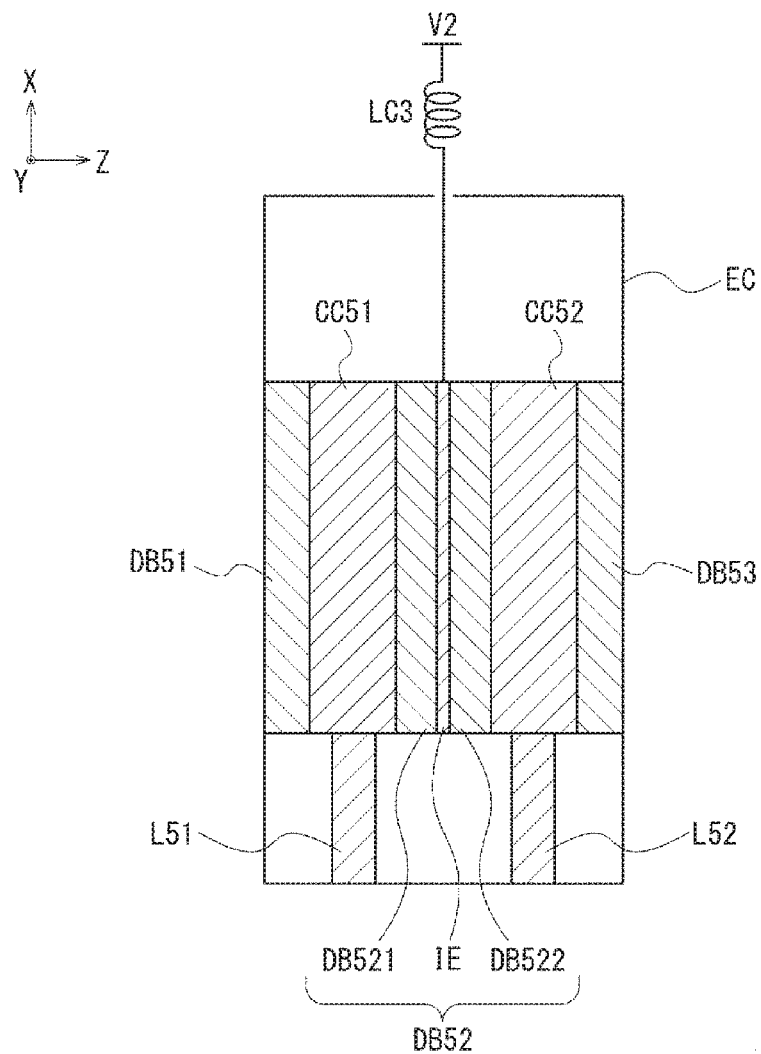
FIG. 22 is a cross section of a unit structure taken along a line XXI-XXI in FIG. 21.

A technique for changing an effective dielectric constant has been described above with reference to FIG. 2. In this embodiment, another example of a technique for changing an effective dielectric constant is described. FIG. 21 is a diagram showing a configuration example of a dielectric according to a fifth embodiment. FIG. 22 is a cross section of a unit structure U1 taken along a line XXI-XXI in FIG. 21. FIGS. 21 and 22 show a coaxial line including two unit structures U1 and U2 as an example. For the sake of convenience, a dielectric DB1 of the unit structure U1 is referred to as DB51, and parts corresponding to a dielectric DB2 of the unit structure U1 and a dielectric DB1 of the unit structure U2 are collectively referred to DB52. Further, a dielectric DB2 of the unit structure U2 is represented by DB53. Further, in FIG. 21, an outer conductor EC is indicated by broken lines in order to simplify the drawing. Inner conductors of the unit structures U1 and U2 are represented by CC51 and CC52, respectively. Inductors of the unit structures U1 and U2 are represented by L51 and L52, respectively.

In this embodiment, an inner electrode IE disposed between the dielectrics DB521 and DB522 is provided inside the dielectric DB52. In other words, in this embodiment, the inner electrode IE is disposed between the dielectric DB2 (the dielectric DB521) of the unit structure U1 and the dielectric DB1 (the dielectric DB522) of the unit structure U2.

The inner electrode IE is a disk-shaped electrode and coaxially disposed with the unit structures U1 and U2. A DC voltage is applied to the inner electrode IE through a choke circuit including an inductor LC3 and a DC variable voltage source V2. The inductor LC3 is, for example, inserted into an opening formed in the outer conductor EC, so that the DC variable voltage source V2 is connected to the inner electrode IE. In FIG. 21, illustration of the holes formed in the outer conductor EC is omitted to simplify the drawing.

It should be noted that it is preferable to use, as the inductor LC3, an inductor having an impedance having such magnitude that an impedance between the inner electrode IE and the external power supply (the DC variable voltage source V2) becomes negligible in frequencies to which the coaxial line, the resonator, or the filter including the unit structure(s) according to this embodiment incorporated therein is applied.

When a voltage is applied to the inner electrode IE, the inner electrode IE and the inner conductors of the unit structures U1 and U2 function as capacitors and electric charges are accumulated therein. In this way, it is possible to change the substantial relative dielectric constant of the space in which the dielectric is disposed.

According to this configuration, it is possible to adjust the frequency characteristic of the coaxial line, the resonator, or the filter just by changing a DC voltage applied to the dielectric. Further, since the above-described configuration does not require a driving unit or the like for driving the dielectric, it is advantageous in regard to the reduction in the size of the coaxial line, the resonator, or the filter, and the improvement in the reliability thereof.

Note that although an example in which a DC voltage is applied to the inner electrode disposed inside the dielectric through the choke circuit is described in this embodiment, this configuration is merely an example. In the case where the coaxial line, the resonator, or the filter circuit includes a plurality of dielectrics, needless to say, inner electrodes may be provided in some or all of the plurality of dielectrics and a DC voltage may be applied to these inner electrodes through a choke circuit.

Sixth Embodiment

In this embodiment, relations between diameters of the inner conductors of the above-described coaxial line, the resonator, and the filter, and diameters of the outer conductors thereof are explained. In the following description, a diameter of an inner conductor is represented by "a" and a diameter of an outer conductor (a distance from a central axis to an inner surface of the outer conductor) is represented by "b". Further, an inductance of each unit structure is represented by "L0" and a capacitance thereof is represented by "C0". The inductance L0 is mainly an inductance given by an inductor connected to the inner conductor. Further, a normalized value that is obtained by taking the number of inductors connected to each inner conductor and the size thereof into consideration is used as the inductance L0. Further, a value that is obtained by normalizing capacitances between unit structures while taking the number of unit structures into consideration is used as the capacitance C0.

The inductor connected to each inner conductor is considered to have a cylindrical shape and its radius is represented by "r". In this case, the below-shown Expressions (1) and (2) hold for the inductance L and the capacitance C of the coaxial line, the resonator, and the filter.

[Expression 1]

$$L = L0 \cdot (b-a) \left[ \log\left\{\frac{2(b-a)}{r}\right\} - 1 \right] \quad (1)$$
$$\cong L0(b-a)$$

[Expression 2]

$$C = C0 \cdot a^2 \quad (2)$$

Further, a resonance frequency ωr is expressed by the following Expression (3).

[Expression 3]

$$\omega r = \frac{1}{\sqrt{L0 \cdot C0}} \cdot \frac{1}{a} \cdot \frac{1}{\sqrt{b-a}} \quad (3)$$

In the above-shown expressions, based on dωr/da=0, the following Expression (4) is obtained.

[Expression 4]

$$\frac{1}{a^2} \cdot \frac{1}{\sqrt{b-a}} = \frac{1}{2a} \cdot \frac{1}{(b-a)^{3/2}} \quad (4)$$
$$\therefore a = \frac{2}{3}b$$

That is, when the diameter "a" of the inner conductor is two thirds (⅔) of the diameter "b" of the outer conductor, the resonance frequency has the smallest value (the minimum value). This result is independent of the number of unit structures and the number and the size (the thickness) of inductors. Therefore, it is possible to provide a coaxial line, a resonator, and a filter having a minimum resonance frequency by simply adjusting the diameter "a" of the inner conductor to two thirds (⅔) of the diameter "b" of the outer conductor.

Other Embodiments

Note that the present invention is not limited to the above-described embodiments and can be modified as appropriate without departing from the spirit of the present invention. For example, in the above-described resonator and the filter, the number of unit structures is one. However, needless to say, they may adopt a configuration in which at least two unit structures are repeatedly arranged in the central-axis direction as in the case of the coaxial line. For example, regarding the filter shown in FIG. 17, N unit structures U31 and N unit structures U32 (N is an integer no less than two) can be alternately and repeatedly arranged in the central-axis direction (the Z-direction). In this case, the unit structures U31 repeatedly arranged in the Z-direction may also be referred to as a first coaxial line 1 and the unit structures U32 repeatedly arranged in the Z-direction are also referred to as a second coaxial line. Needless to say, the outer conductors of the unit structures U31 repeatedly arranged in the Z-direction are connected to one another and are configured as one outer conductor. Further, the outer conductor of the unit structures U32 repeatedly arranged in the Z direction are connected to one another and are configured as one outer conductor. Then, the outer conductors of the first and second coaxial lines can be connected together through an opening and hence they form one outer conductor. Note that an assembly that is formed by repeatedly arranging N coaxial lines in the central-axis direction is also referred to as a coaxial line group.

For example, in the above-described filter, a configuration in which at least two unit structures are connected to one another on an X-Y plane (in a direction perpendicular to or intersecting the central axis (the Z-axis)) is explained. However, three or more unit structures may be connected to one another on the X-Y plane (in the direction perpendicular to or intersecting the central axis (the Z-axis)). In other words, in the above-described filter, at least M unit structures (M is an integer no less than two) may be connected to one another on the X-Y plane (in the direction perpendicular to or intersecting the central axis (the Z-axis)). In this case, a first input/output terminal, i.e., one of the two input/output terminals may be electrically coupled to the inner conductor of one of the M unit structures. A second input/output terminal, i.e., the other of the two input/output terminal may be electrically coupled to the inner conductor of one of the M unit structures other than the unit structure connected to the first input/output terminal. Needless to say, the outer conductors of the unit structures can be connected together and hence they can form one outer conductor.

Needless to say, in the above-described filter, N unit structures (N is an integer no less than two) may be repeatedly arranged in the central-axis direction (the Z-direction) and at least M repeatedly-arranged unit structures may be coupled to one another on the X-Y plane (in the direction perpendicular to or intersecting the central axis (the Z-axis)).

Further, for example, a filter can also be formed by arranging a plurality of coaxial lines (resonators), each of which is formed by one or a plurality of unit structures arranged in the central-axis direction, in the central-axis direction with spaces therebetween. In this case, a first input/output terminal, i.e., one of the two input/output terminals may be electrically coupled to the inner conductor of one of the plurality of unit structures. A second input/output terminal, i.e., the other of the two input/output terminal may be electrically coupled to the inner conductor of one of the plurality of unit structures other than the unit structure connected to the first input/output terminal. Needless to say, the outer conductors of the unit structures can be connected together and hence they can form one outer conductor. Further, in this case, a conductive plate is disposed in each of both ends of the plurality of coaxial lines (resonators) arranged in the central-axis direction and is electrically connected to the above-described one outer conductor.

In the above-described filter, an example in which two unit structures are arranged on a plane perpendicular to the central axis is explained. However, the two unit structures may be arranged in the central-axial direction with a space therebetween. Further, although an example in which two unit structures are arranged on a plane perpendicular to the central axis is explained, a plurality of groups of unit structures may be arranged on a place perpendicular to the central axis. Furthermore, a plurality of groups of unit structures may be arranged in the axial direction with spaces therebetween.

REFERENCE SIGNS LIST 21, 22 CONDUCTIVE PLATE
31, 32 OPENING
100 COAXIAL LINE
200 RESONATOR
300 FILTER
C, C0 CAPACITANCE
C1-C8 VARIABLE CAPACITOR
CC1, CC31, CC32, CC51, CC52 INNER CONDUCTOR
DB1, DB2, DB41-DB43, DB51-DB53, DB521, DB522 DIELECTRIC
EC, EC1-EC3 OUTER CONDUCTOR
EC21, EC22, EC31-EC34 OUTER CONDUCTIVE PLATE
H1, H2 HOLE
IE INNER ELECTRODE
L, L0 INDUCTANCE
L1-L9, LC1-LC3, L31, L31, L51, L52 INDUCTOR
SM1, SM2 SUPPORT PART
T1, T2 TERMINAL
T11, T12, T31, T32 INPUT/OUTPUT TERMINAL
U1-U9, U31, U32 UNIT STRUCTURE
V1, V2 DC VARIABLE VOLTAGE SOURCE
W1, W2 WIRING LINE

The invention claimed is:

1. A coaxial line comprising:
   a plurality of unit structures repeatedly arranged in a direction of a central axis,
   wherein each of the plurality of unit structures comprises:
     an inner conductor,
     two dielectrics arranged in the direction of the central axis so as to sandwich the inner conductor therebetween,
     an outer conductor configured to envelop the inner conductor and the two dielectrics, and
     an inductor connected between the inner conductor and the outer conductor;
   wherein at least part of the inner conductor of at least one of the plurality of unit structures is arranged at a radial center of the outer conductor of the at least one of the plurality of unit structures, and
   wherein the inner conductor of the at least one of the plurality of unit structures is physically separated from an inner conductor of another of the plurality of unit structures by at least one of the two dielectrics of the one of the plurality of unit structures.

2. The coaxial line according to claim 1, wherein each of the two dielectrics of the at least one of the plurality of unit structures is configured so that an effective relative dielectric constant of a space where each of the two dielectrics of the at least one of the plurality of unit structures is disposed becomes variable.

3. The coaxial line according to claim 1, wherein the inner conductor of the at least one of the plurality of unit structures is disposed on the central axis.

4. The coaxial line according to claim 1, further comprising two support parts respectively extending from the two dielectrics of the at least one of the plurality of unit structures in a direction perpendicular to the central axis, wherein
   an area where at least one of the two dielectrics of the at least one of the plurality of unit structures overlaps the corresponding inner conductor in the direction of the central axis is capable of being adjusted by driving the corresponding two support parts in the direction perpendicular to the central axis.

5. The coaxial line according to claim 1, further comprising a circuit configured to connect at least one of the two dielectrics of the at least one of the plurality of unit structures between a variable DC power supply insulated from the corresponding outer conductor and a ground potential, wherein a relative dielectric constant is changed by a DC voltage applied from the variable DC power supply to the at least one of the two dielectrics of the at least one of the plurality of unit structures.

6. The coaxial line according to claim 1, further comprising:
a variable DC power supply insulated from the outer conductor of the at least one of the plurality of unit structures; and
an inner electrode disposed inside at least one of the two dielectrics of the at least one of the plurality of unit structures, wherein
an effective relative dielectric constant of a space where the at least one of the two dielectrics of the at least one of the plurality of unit structures is disposed is changed by a DC voltage applied from the variable DC power supply to the inner electrode.

7. The coaxial line according to claim 1, wherein
the inner conductor of the at least one of the plurality of unit structures has a cylindrical shape having a circle perpendicular to the central axis as a base thereof,
the outer conductor of the at least one of the plurality of unit structures has a cylindrical shape having a circle perpendicular to the central axis as a base thereof, and
a diameter of the base of the inner conductor of the at least one of the plurality of unit structures is two thirds (⅔) of a distance from an inner surface of the cylinder formed by the outer conductor of the at least one of the plurality of unit structures to the central axis.

8. A resonator comprising:
a plurality of coaxial lines arranged side by side in the direction of the central axis, at least one the plurality of coaxial lines being the coaxial line according to claim 1;
a first input/output terminal used for receiving/outputting a signal;
a second input/output terminal used for receiving/outputting the signal, the second input/output terminal being spaced from the first input/output terminal; and
two conductor plates disposed at two ends of each of the one or plurality of coaxial lines in the direction of the central axis and connected to at least one of the outer conductors of the at least one of the plurality of coaxial lines, wherein
the first and second input/output terminals are electrically coupled to at least one of the inner conductors of the at least one of the plurality of coaxial lines through one of an inductive coupling, a capacitive coupling, and a direct connection coupling.

9. The resonator according to claim 8, wherein an end of a wiring line used for receiving/outputting the signal in the first and second input/output terminals is connected to a surface of at least one of the outer conductors of the at least one of the plurality of coaxial lines located on a side of at least one of the inner conductors of the at least one of the plurality of coaxial lines.

10. The resonator according to claim 8, wherein an open end of a wiring line used for receiving/outputting the signal in the first and second input/output terminals is disposed in a place where the capacitive coupling with at least one of the inner conductors of the at least one of the plurality of coaxial lines is formed.

11. The resonator according to claim 10, further comprising a conductive flat plate disposed at the open end.

12. A filter comprising:
M coaxial lines (M is an integer no less than two) arranged side by side in a direction intersecting the central axis, each of the M coaxial lines being the coaxial line according to claim 1;
a first input/output terminal used for receiving/outputting a signal;
a second input/output terminal used for receiving/outputting the signal, the second input/output terminal being spaced from the first input/output terminal; and
M sets of two conductor plates disposed at two ends of the M coaxial lines, respectively, in the direction of the central axis and connected to the outer conductors of the M coaxial lines, respectively, wherein
each of the M coaxial lines is disposed in a place where the coaxial line overlaps an adjacent coaxial line,
spaces inside the outer conductors of each pair of two adjacent coaxial lines among the M coaxial lines are connected to each other through an opening,
the first input/output terminal is electrically coupled to at least one of the inner conductors of at least one of the M coaxial lines through one of an inductive coupling, a capacitive coupling, and a direct connection coupling, and
the second input/output terminal is electrically coupled to at least one of the inner conductors of one other of the M coaxial lines other than at least one of the M coaxial lines connected to the first input/output terminal through one of the inductive coupling, the capacitive coupling, and the direct connection coupling.

13. A coaxial line comprising:
a plurality of unit structures repeatedly arranged in a direction of a central axis,
wherein each of the plurality of unit structures comprises:
an inner conductor,
two dielectrics arranged in the direction of the central axis so as to sandwich the inner conductor therebetween,
an outer conductor configured to envelop the inner conductor and the two dielectrics, and
an inductor connected between the inner conductor and the outer conductor, and
wherein each of the two dielectrics is configured so that an effective relative dielectric constant of a space where each of the two dielectrics is disposed becomes variable.

14. A coaxial line comprising:
a plurality of unit structures repeatedly arranged in a direction of a central axis,
wherein each of the plurality of unit structures comprises:
an inner conductor,
two dielectrics arranged in the direction of the central axis so as to sandwich the inner conductor therebetween,
an outer conductor configured to envelop the inner conductor and the two dielectrics,
an inductor connected between the inner conductor and the outer conductor, and
two support parts respectively extending from the two dielectrics in a direction perpendicular to the central axis, and
wherein an area where at least one of the two dielectrics overlaps the inner conductor in the direction of the central axis is capable of being adjusted by driving the two support parts in the direction perpendicular to the central axis.

* * * * *

UNITED STATES PATENT AND TRADEMARK OFFICE
CERTIFICATE OF CORRECTION

PATENT NO. : 10,673,112 B2
APPLICATION NO. : 15/770640
DATED : June 2, 2020
INVENTOR(S) : Tomoya Kaneko and Daisuke Iwanaka Page 1 of 1

It is certified that error appears in the above-identified patent and that said Letters Patent is hereby corrected as shown below:

In the Claims

Column 13, Line 34; In Claim 8, after "one", insert --of--

Signed and Sealed this
Seventeenth Day of November, 2020

Andrei Iancu
*Director of the United States Patent and Trademark Office*